(12) United States Patent
Schmitt et al.

(10) Patent No.: US 10,714,910 B2
(45) Date of Patent: Jul. 14, 2020

(54) SYSTEM COMPRISING A BUS BAR DEVICE AND A POWER CONVERTER HOUSING, AND METHOD FOR THE PRODUCTION THEREOF, POWER CONVERTER FOR A VEHICLE, AND VEHICLE

(71) Applicant: VALEO SIEMENS EAUTOMOTIVE GERMANY GMBH, Erlangen (DE)

(72) Inventors: Matthias Schmitt, Schwabach (DE); Alexandros Kourgialis, Röslau (DE); Anna Kaiser, Nürnberg (DE); Andrei Alexandru, Fürth (DE); Christoph Hoyler, Kirchensittenbach (DE); Michael Nobel, Nürnberg (DE)

(73) Assignee: VALEO SIEMENS EAUTOMOTIVE GERMANY GMBH, Erlangen (DE)

( * ) Notice: Subject to any disclaimer, the term of this patent is extended or adjusted under 35 U.S.C. 154(b) by 0 days.

(21) Appl. No.: 16/515,722

(22) Filed: Jul. 18, 2019

(65) Prior Publication Data

US 2020/0044422 A1 Feb. 6, 2020

(30) Foreign Application Priority Data

Jul. 31, 2018 (DE) .......................... 10 2018 118 525

(51) Int. Cl.
*H02B 1/20* (2006.01)
*H02M 1/32* (2007.01)
*H02M 7/48* (2007.01)

(52) U.S. Cl.
CPC ................ *H02B 1/20* (2013.01); *H02M 1/32* (2013.01); *H02M 7/48* (2013.01); *H02M 2001/327* (2013.01)

(58) Field of Classification Search
CPC ....................................................... H02B 1/20
See application file for complete search history.

(56) References Cited

U.S. PATENT DOCUMENTS 7,800,213 B2   9/2010   Bayerer
8,520,386 B2   8/2013   Bott et al.
(Continued)

FOREIGN PATENT DOCUMENTS

DE   102004018469 B3   10/2005
DE   102007003875 A1   8/2008
(Continued)

*Primary Examiner* — Mukundbhai G Patel
(74) *Attorney, Agent, or Firm* — Manabu Kanesaka

(57) ABSTRACT

The invention relates to a system, including a bus bar device and a power converter housing, wherein the bus bar device includes a stack made of at least two bus bars and an electrically insulating insulation body, which encloses the bus bars in two insulating regions of the bus bar device, wherein each bus bar includes two opposing base surfaces extending in the direction of current flow and lateral surfaces connecting the base surfaces and extending in the direction of current flow, wherein the bus bar device includes a temperature control region formed between the insulating regions, in which the insulation body has an opening that exposes one of the lateral surfaces and a portion of at least one of the base surfaces of a respective bus bar, wherein the bus bars are thermally connected to the power converter housing in the temperature control region by a heat transfer means.

10 Claims, 4 Drawing Sheets

(56) References Cited

U.S. PATENT DOCUMENTS

| | | | |
|---|---|---|---|
| 9,252,582 B2* | 2/2016 | Li | H02G 5/00 |
| 9,667,040 B2* | 5/2017 | Fujita | H02B 1/20 |
| 2011/0188279 A1* | 8/2011 | Aiba | H02M 1/00 |
| | | | 363/141 |
| 2015/0173238 A1* | 6/2015 | Nakanishi | H02M 7/003 |
| | | | 361/709 |

FOREIGN PATENT DOCUMENTS

| | | |
|---|---|---|
| DE | 102016200724 A1 | 7/2017 |
| WO | 2010/066482 A1 | 6/2010 |

* cited by examiner

SYSTEM COMPRISING A BUS BAR DEVICE AND A POWER CONVERTER HOUSING, AND METHOD FOR THE PRODUCTION THEREOF, POWER CONVERTER FOR A VEHICLE, AND VEHICLE

RELATED APPLICATIONS

The present application is based on, and claims priority from, German Application No. 10 2018 118 525.1 filed Jul. 31, 2018, the disclosure of which is hereby incorporated by reference herein in its entirety.

The present invention relates to a system comprising a bus bar device and a power converter housing, wherein the bus bar device comprises a stack made of at least two bus bars and an electrically insulating insulation body, which encloses the bus bars in two insulating regions of the bus bar device, wherein each bus bar comprises two opposing base surfaces extending in the direction of current flow and lateral surfaces connecting the base surfaces and extending in the direction of current flow.

In addition, the invention relates to a method for producing such a system and to a power converter for a vehicle and to a vehicle.

Bus bar devices for power converters are used to transport high currents and frequently include an electrically insulating insulation body, which is created by insert-molding bus bars arranged to form a stack. The bus bar device is typically attached to a power converter housing. During operation, the bus bars become heated by the electrical current flowing through them. However, due to the high heat transfer resistance of the insulation body, the heat dissipation from such bus bar devices is unsatisfactory. As a result, accordingly high line cross-sections of the bus bars are required; however, due to the requirements with regard to an installation space-saving and weight-saving design in the electromobility field, this is not desirable.

It has already been proposed to use powder-coated bus bars, which are directly attached to easily thermally conducting metal parts of the power converter housing. However, such powder-coated bus bars are expensive to produce, and the production process does not allow connecting elements to be formed, such as can be provided on an insulation body created in an injection molding process, for example so as to arrange additional components on the bus bar device.

It is therefore the object of the invention to provide an improved option for dissipating heat from a bus bar device.

To achieve this object, it is provided, according to the invention, in a system of the type described at the outset that the bus bar device includes a temperature control region formed between the insulating regions, in which the insulation body has an opening that exposes one of the lateral surfaces and a portion of at least one of the base surfaces of a respective bus bar, wherein the bus bars are thermally connected to the power converter housing in the temperature control region by a heat transfer means.

The invention is based on the consideration of forming the opening in the insulation body of the bus bar device, so that the bus bars are not completely covered by the insulation body in the temperature control region. These exposed or uncovered portions of the bus bar can then be coupled to the power converter housing via the, advantageously electrically insulating, heat transfer means. A heat transfer via the insulation body having a comparatively high heat transfer resistance is thus avoided, and instead the considerably lower heat transfer resistance of the heat transfer means is utilized.

In this way, it is advantageously possible to use bus bar devices in the system according to the invention which have a smaller line cross-section than conventional bus bar devices, while offering the same ampacity, and can accordingly be produced in a more weight-saving and cost-effective manner. At the same time, the bus bar device of the system according to the invention is also more installation space-saving than a conventional bus bar device. Advantageously, no additional components, beyond the easily available heat transfer means, are required to implement the improved cooling capacity in the system according to the invention.

The bus bars typically comprise a core made of copper, which may additionally be coated with a metal layer. The power converter housing is preferably made of aluminum, at least in the region connected to the heat transfer means. The power converter housing can be a die cast housing. The power converter housing preferably has active cooling, and in particular liquid cooling, so as to efficiently dissipate heat from the bus bars. The stack can also comprise three or more bus bars. The bus bars are typically arranged in such a way that the base surfaces thereof are disposed on top of one another. The base surfaces typically have a larger surface area than the lateral surfaces. In the temperature control region, the insulation body typically covers the other lateral surfaces, that is the lateral surfaces not in contact with the heat transfer means, and portions of the two base surfaces. In the temperature control region, a base surface may also be completely covered by the insulation body, provided that the other base surface is partially exposed.

It is particularly advantageous in the system according to the invention when the insulation body, in the temperature control region, has a protrusion between each pair of adjoining bus bars, which extends along the base surfaces beyond the exposed lateral surface. In other words, the protrusion projects further into the heat transfer means than the individual bus bars. The protrusion allows the creepage distance between the bus bars to be increased, thereby increasing the electrical safety of the system.

Particularly advantageously, it may further be provided in the system according to the invention that the insulation body comprises a spacer in the insulating region, which rests on the power converter housing and spaces the bus bars apart from the power converter housing in the temperature control region. The spacer thus increases the distance between the bus bars and the power converter housing, so that a larger space filled with the heat transfer means is formed between the bus bars and the power converter housing. This advantageously increases the breakdown voltage between the bus bars and the power converter housing.

As an alternative or in addition, so as to increase the distance between the power converter housing and the bus bars, it may be provided that the power converter housing has a depression receiving the heat transfer means.

Advantageously, the heat transfer means is a gap filler. This is characterized by a low heat transfer resistance and easy processability. The bus bars may be immersed in the gap filler in the temperature control region, so that the gap filler creates the thermal connection as well as the electrical insulation with respect to the power converter housing. This, in particular, enables particularly simple, automated manufacturing of the system.

Generally, it is preferred when the system includes multiple temperature control regions, which are each separated by an insulating region. The bus bar device can include a further temperature control region that is separated from the first insulating region by a further insulating region, wherein the bus bars extend in an angled manner, in particular by 90°, in the further insulating region. Such angled sections of bus bar devices can be intended for adaptation to the shape of a housing corner of the power converter housing.

Moreover, it may be provided in the system according to the invention that a further temperature control region, which is separated from the first insulating region by a further insulation, is provided, wherein the stack comprises a further bus bar in the further temperature control region, which is surrounded by the insulation body in the first temperature control region and/or is not thermally connected to the power converter housing by the heat transfer means. Regions in which the stack, as described above, includes a different number of bus bars in some sections are, in particular, those at which the individual bus bars make contact, for example with power semiconductors. Efficient heat dissipation can also be achieved in these regions through an appropriate design of the insulation body.

In addition, the invention relates to a method for producing a system comprising a bus bar device and a power converter housing, comprising the following steps:

providing a power converter housing;
applying a heat transfer means to the power converter housing;
providing a bus bar device, which comprises a stack made of at least two bus bars and an electrically insulating insulation body, which encloses the bus bars in two insulating regions of the bus bar device, wherein each bus bar comprises two opposing base surfaces extending in the direction of current flow and lateral surfaces connecting the base surfaces and extending in the direction of current flow, wherein the bus bar device includes a temperature control region formed between the insulating regions, in which the insulation body has an opening that exposes one of the lateral surfaces and a portion of at least one of the base surfaces of a respective bus bar; and
introducing the bus bars exposed in the temperature control region into the heat transfer means.

The heat transfer means is preferably a liquid heat transfer means, wherein the term "liquid" also covers viscous heat transfer means, and in particular suspensions. The bus bar device is preferably attached to the power converter housing before or after the heat transfer means is applied. An attachment means formed on the insulation body, and in particular a tab having a through-hole, may be used for this purpose.

Particularly preferably, the steps of applying the heat transfer means and/or of introducing the bus bar into the heat transfer means and/or of attaching the bus bar device to the power converter housing are carried out automatically, for example by means of a robot. Furthermore, the step of providing the bus bars can include insert molding the bus bars with a plasticized plastic material, in particular a thermoplastic material, in such a way that the insulation body is created with the insulating regions and the temperature control region.

In addition, the invention relates to a power converter for a vehicle, comprising a system according to the invention or obtainable by the method according to the invention and a power unit accommodated in the power converter housing. The power converter is preferably designed as an inverter.

Moreover, the invention relates to a vehicle, comprising an electrical machine, which is configured to drive the vehicle, and a power converter according to the invention, which is configured to provide an alternating current for the electrical machine.

All embodiments for the system according to the invention can be applied analogously to the power converter according to the invention, to the vehicle according to the invention, and to the method according to the invention, so that the above-described advantages can also be achieved with these. In particular, all above-described embodiments of the system according to the invention can be used within the scope of the method according to the invention.

Further advantages and details of the present invention will be apparent from the exemplary embodiments described hereafter and based on the drawings. These are schematic illustrations. In the drawings.

Figure 1:
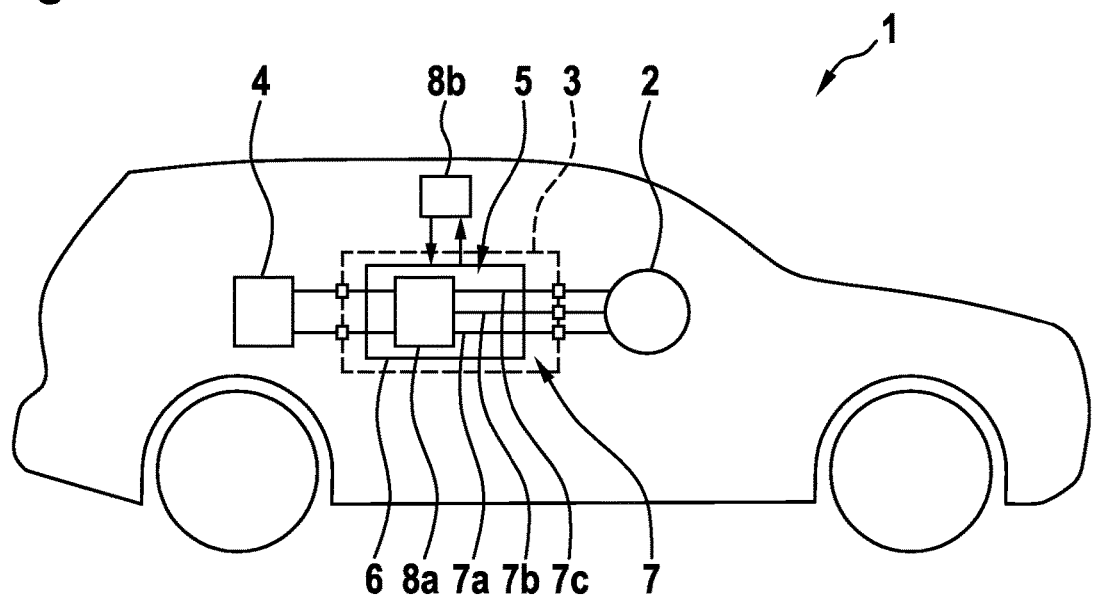
FIG. 1 shows a schematic diagram of an exemplary embodiment of the vehicle according to the invention comprising an exemplary embodiment of the power converter according to the invention.

FIG. 1 shows a schematic diagram of an exemplary embodiment of a vehicle 1, comprising an electrical machine 2, which is configured to drive the vehicle 1, and an exemplary embodiment of a power converter 3, which is configured to provide an alternating current for the electrical machine 2.

The power converter 3 is configured as an inverter and used to convert a direct current, provided by a high voltage battery 4, into a three-phase or polyphase alternating current. The power converter 3 comprises a system 5 including a power converter housing 6 and a bus bar device 7 comprising multiple bus bars 7a, 7b, 7c. Furthermore, a power unit 8a including multiple power semiconductor elements is accommodated in the power converter housing 6. The power converter housing 6 comprises connections for liquid cooling, wherein a cooling unit 8b of the vehicle 1 is connected thereto, which additionally is also configured to cool the electrical machine 2.

Figure 2:
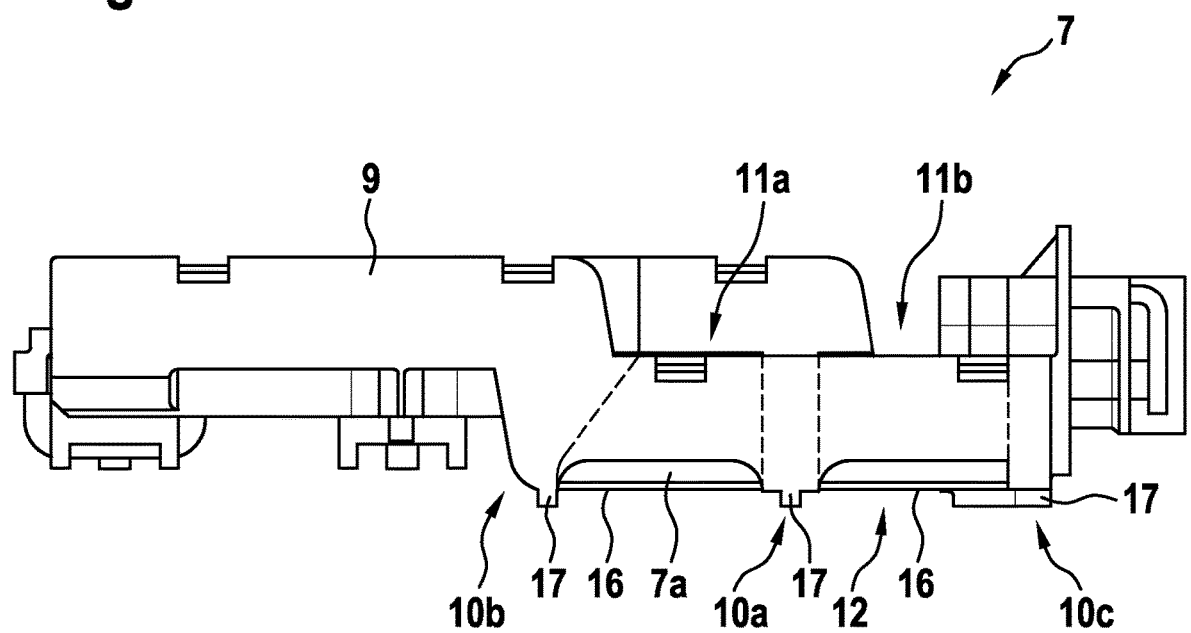
FIG. 2 shows a side view of a bus bar device of an exemplary embodiment of the system according to the invention.
Figure 3:
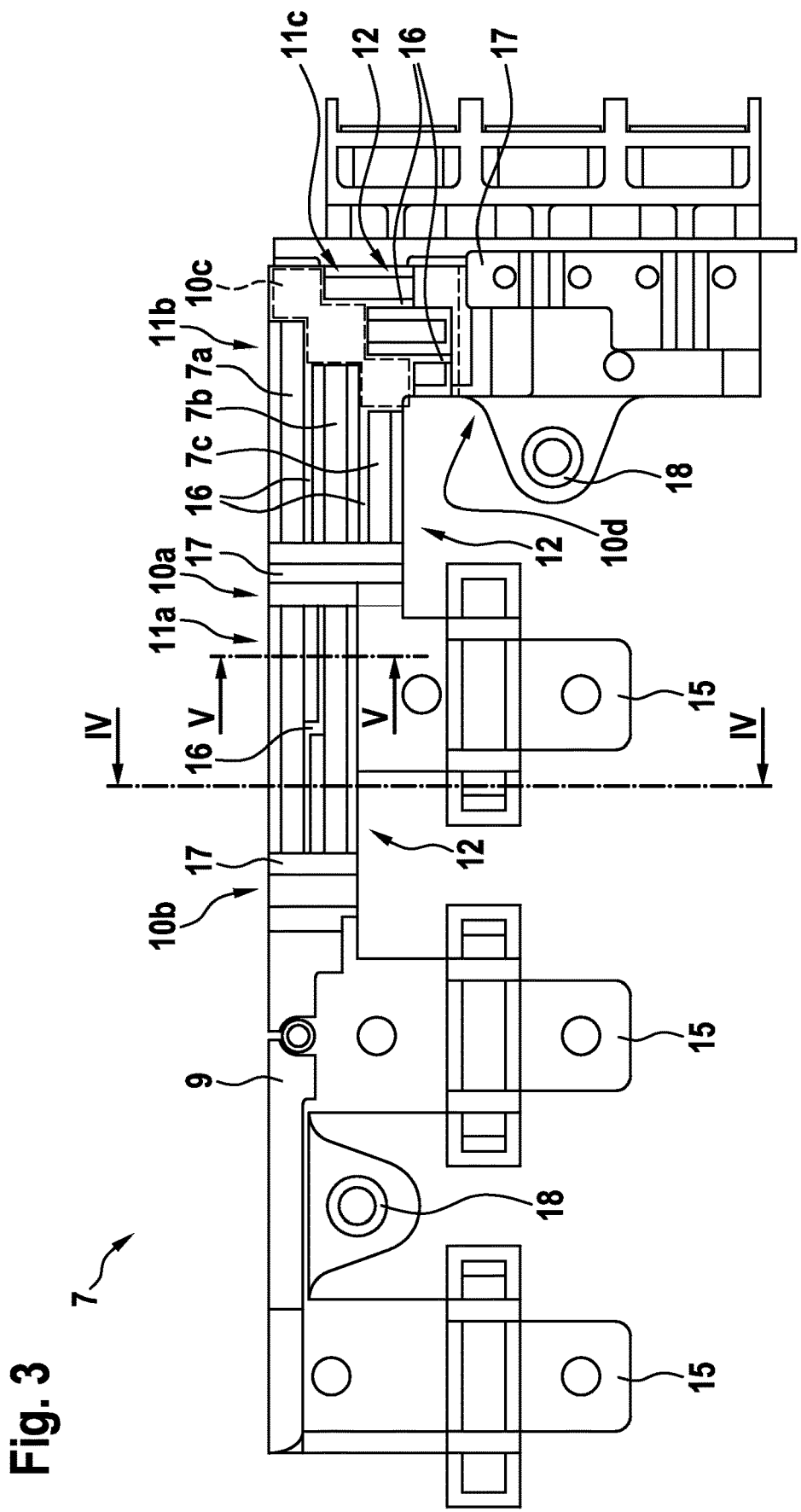
FIG. 3 shows a top view onto the bus bar device shown in FIG. 2.
Figure 4:
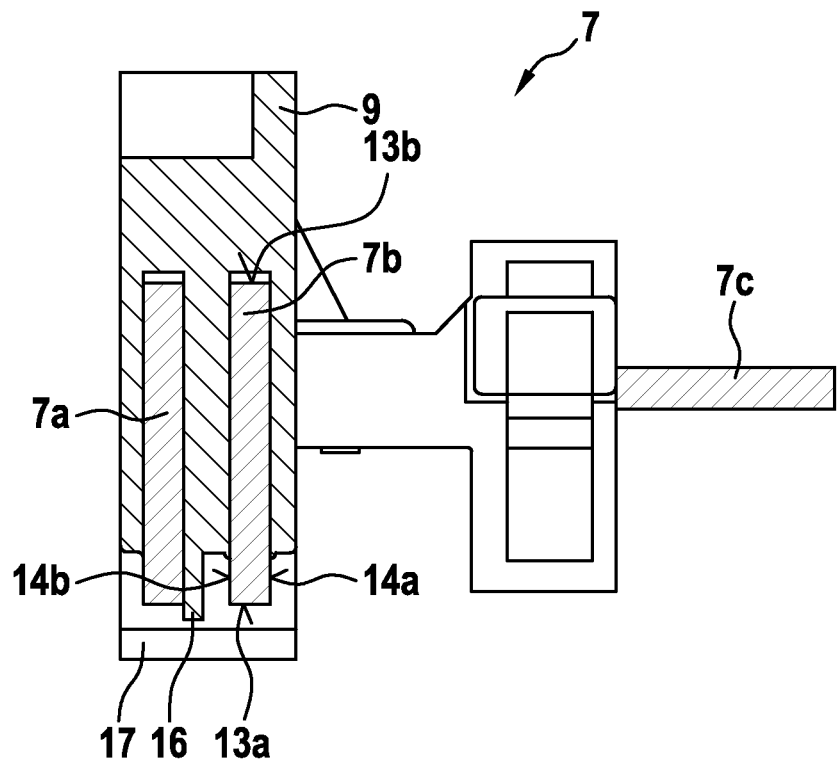
FIG. 4 shows a cut view of the bus bar device shown in FIG. 2 along a line IV-IV in FIG. 3.

The system 5 corresponds to one of the exemplary embodiments described hereafter:

FIGS. 2 to 4 show a bus bar device 7 according to a first exemplary embodiment of the system 5 (see FIG. 5), FIG. 2 showing a side view, FIG. 3 showing a top view, and FIG. 4 showing a cut view along a line IV-IV in FIG. 3.

The bus bar device 7 comprises the bus bars 7a-7c, of which only the bus bar 7a is visible in FIG. 2. As is apparent from FIG. 3, the bus bars 7a-7c form a stack in which the respective base surfaces 14a, 14b (see FIG. 4) of the bus bars 7a-7c are situated opposite from and parallel to one another.

In addition, the bus bar device 8 comprises an electrically insulating insulation body 9, which is created by insert molding the bus bars 7a-7c with a thermoplastic material. The insulation body forms a first insulating region 10a, a second insulating region 10b, a third insulating region 10c, and a fourth insulating region 10d, which is only visible in FIG. 3.

Between a respective pair of adjoining insulating regions 10a-10d, the insulation body 9 forms temperature control regions 11a, 11b and a third temperature control region 11c, which is only visible in FIG. 3. For this purpose, the insulation body 9 has an opening 12 in each temperature control region 11a-11c, which exposes a lateral surface 13a (see FIG. 4) and a portion of the base surfaces 14a, 14b (see FIG. 4) of a respective bus bar 7a-7c. A lateral surface 13b situated opposite the lateral surfaces 13a and the remaining portions of the base surfaces 14a, 14b are enclosed in the temperature control region 11a-11c by the insulation body 9.

In the third insulating region 10c, the bus bars 7a-7c extend angled by 90°. Moreover, the third bus bar 7c ends in the first temperature control region 10a and, at the free end thereof, forms a tab-like connecting section 15 for making contact with the power unit 8a. This likewise takes place, consecutively, in the second insulating region 10b for the second bus bar 7b and the first bus bar 7a. As is apparent, in particular, from FIG. 2, the stack has a vertical offset in the second insulating region 10b.

As can be derived from the cut illustration from FIG. 4, the insulation body has a protrusion 16 in the temperature control region 11a, and two protrusions 16 in each of the temperature control regions 11b, 11c, which are located between a respective pair of adjoining bus bars 7a-7c. The protrusion 16 extends along the base surfaces 14a, 14b beyond the exposed lateral surfaces 13a and rests in each case against one of the bus bars 7a-7c.

As is apparent from FIG. 3, the protrusion 16 has a central offset, as a result of which the bus bar 7a-7c against which the protrusion 16 rests changes. This offset facilitates the formation of the protrusion 16 during injection molding, in which a protrusion 16 standing freely between the bus bars 7a, 7b could only be implemented with undue complexity.

Moreover, the first insulating region 10a, the second insulating region 10b and the fourth insulating region 10d each comprise a spacer 17. The spacers 17 are formed on the side of the insulation body 9 which has the opening 12.

Moreover, the insulation body 9 comprises multiple attachment means 18 in the form of protruding tabs having a through-hole, so as to attach the bus bar device 7 to the power converter housing 6, for example by means of a screw.

Figure 5:
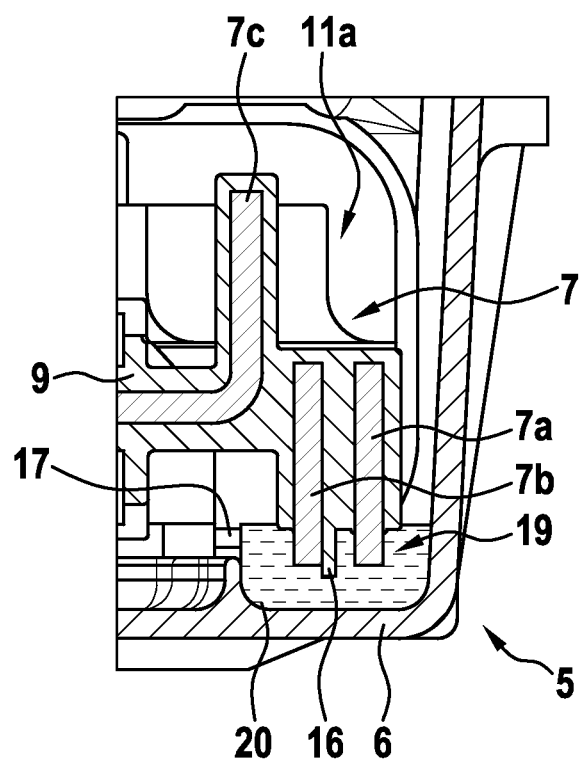
FIG. 5 shows a cut partial view of the system along a line V-V in FIG. 3.

FIG. 5 shows a cut partial view of the system 5 along a line V-V in FIG. 3, which shows a detail of the bus bar device 7 in a position in which it is accommodated in the power converter housing 6. In a respective temperature control region, which is the first temperature control region 11a here, the system 5 comprises a heat transfer means 19 in the form of a gap filler processed in liquid form. Exposed sections of the bus bars 7a, 7b, 7c protrude into the heat transfer means 19 in the temperature control regions 11a-11c and are thus thermally connected to the power converter housing 6.

The protrusion 16 protruding beyond the first lateral surface 13a implements an extended creepage distance between the bus bars 7a-7c. The spacer 17 ensures an increased distance between the bus bar 7a-7c and the power converter housing 6, which increases the dielectric strength. So as to further increase the distance, additionally a depression 20 is formed in the power converter housing 6.

Figure 6:
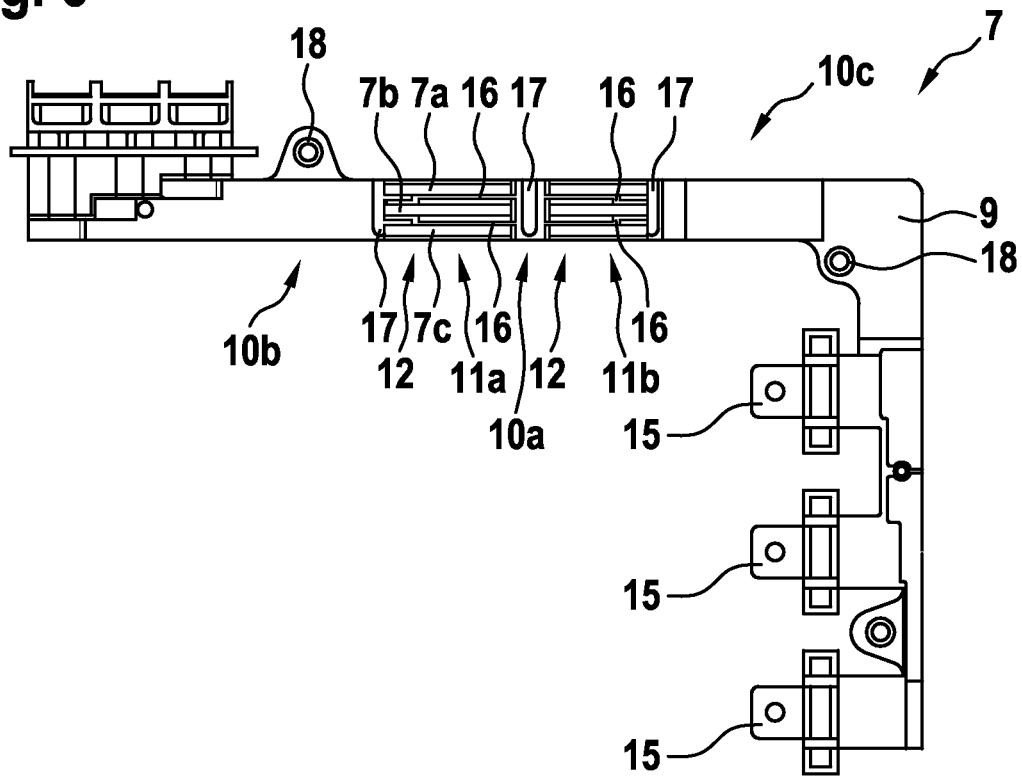
FIG. 6 shows a top view onto a bus bar device according to a further exemplary embodiment of the system according to the invention.

FIG. 6 shows a top view onto a bus bar device 7 according to a further exemplary embodiment of a system 5. Identical or like-acting components compared to the bus bar device 7 shown in FIGS. 2 to 5 are denoted by identical reference numerals.

In the exemplary embodiment according to FIG. 6, three bus bars 7a-7c extend in a rectilinear manner through a total of two temperature control regions 11a, 11b and an interposed insulating region 10a, in particular without a bus bar branching off in the temperature control regions 11a, 11b for forming a connecting section 15. Moreover, no depression is provided in the power converter housing in this exemplary embodiment. The heat transfer means is arranged on a planar surface of the power converter housing, on which the spacers 17 also rest.

Figure 7:
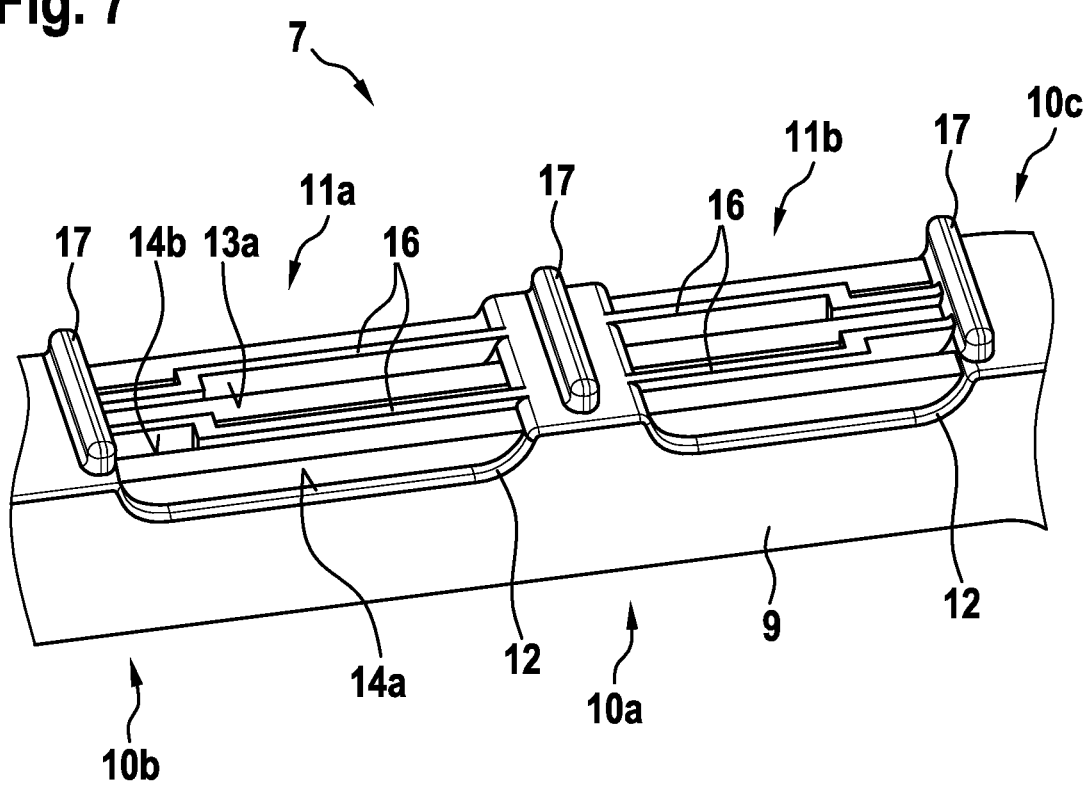
FIG. 7 shows a perspective partial view of the bus bar device shown in FIG. 6.

FIG. 7 shows a perspective partial illustration of the temperature control regions 11a, 11b of the bus bar device 7, in which it is apparent particularly clearly that the opening 12 on the outer base surfaces 14a, 14b is formed by a cut-out from the insulation body 9. The cut-out initially extends in an arc-shaped manner from an insulating region 10b or 10a in the direction of current flow, then extends parallel to the direction of current flow, and at the end of a respective temperature control region 11a, 11b ends in an arc-shaped manner in the opposite insulating region 10a or 10c. This also applies to the temperature control region 11a shown in FIGS. 2 and 3; however, the temperature control region 11b shown there transitions at a right angle into the insulating region 10c. Furthermore, the offset can be seen very well in FIG. 7, wherein it is not arranged centrally here.

Even though the systems 5 described in the preceding exemplary embodiments each comprise three bus bars 7a-7c for the alternating-current-side contacting of the power unit 8a, corresponding systems typically comprising two bus bars can also be designed for the direct-current-side contacting of the power unit 8a.

The invention claimed is:

1. A system (5), comprising a bus bar device (7) and a power converter housing (6), the bus bar device comprising a stack made of at least two bus bars (7a-7c) and an electrically insulating insulation body (9), which encloses the bus bars (7a-7c) in two insulating regions (10a-10d) of the bus bar device (7), each bus bar (7a-7c) comprising two opposing base surfaces (14a, 14b) extending in the direction of current flow and lateral surfaces (13a, 13b) connecting the base surfaces (14a, 14b) and extending in the direction of current flow,
   wherein
   the bus bar device (7) comprises a temperature control region (11a-11c) formed between the insulating regions (10a-10d), in which the insulation body (9) has an opening (12), which exposes one of the lateral surfaces (13a) and a portion of at least one of the base surfaces (14a, 14b) of a respective bus bar (7a-7c), wherein the bus bars (7a-7c) are thermally connected to the power converter housing (6) in the temperature control region (11a-11c) by a heat transfer means (19).

2. The system according to claim 1, wherein the insulation body (9) includes a protrusion (16) in the temperature control region (11a-11c) between each pair of adjoining bus bars (7a-7c), the protrusion extending along the base surfaces (14a, 14b) beyond the exposed lateral surface (13a).

3. The system according to claim 1, wherein the insulation body (9) comprises a spacer (17) in the insulating region (10a-10d), which rests on the power converter housing (6) and spaces the bus bars (7a-7c) apart from the power converter housing (6) in the temperature control region (11a-11c).

4. The system according to claim 1, wherein the power converter housing (6) has a depression (20) receiving the heat transfer means (19).

5. The system according to claim 1, wherein the heat transfer means (19) is a gap filler.

6. The system according to claim 1, wherein the bus bar device (7) includes a further temperature control region (11c) that is separated from the first insulating region (10a) by a further insulating region (10c), the bus bars (7a-7c) extending in an angled manner, in particular by 90°, in the further insulating region (10c).

7. The system according to claim 1, wherein a further temperature control region (11b, 11c), which is separated from the first insulating region (10a) by a further insulating region (10b, 10c, 10d), is provided, the stack comprising a further bus bar (7c) in the further temperature control region (11b, 11c), which is enclosed by the insulation body (9) in the first temperature control region (11a) and/or is not thermally connected to the power converter housing (6) by the heat transfer means (19).

8. A method for producing a system (5) comprising a bus bar device (7) and a power converter housing (6), comprising the following steps:
providing a power converter housing (6);
applying a heat transfer means (19) to the power converter housing (6);
providing a bus bar device (7), which comprises a stack made of at least two bus bars (7a-7c) and an electrically insulating insulation body (9), which encloses the bus bars (7a-7c) in two insulating regions (10a-10d) of the bus bar device (7), wherein each bus bar (7a-7c) comprises two opposing base surfaces (14a, 14b) extending in the direction of current flow and lateral surfaces (13a, 13b) connecting the base surfaces (14a, 14b) and extending in the direction of current flow, wherein the bus bar device (7) includes a temperature control region (11a-11c) formed between the insulating regions (10a-10d) in which the insulation body has an opening (12) that exposes one of the lateral surfaces (13a) and a portion of at least one of the base surfaces (14a, 14b) of a respective bus bar (7a-7c); and
introducing the bus bars (7a-7c) exposed in the temperature control region (11a-11c) into the heat transfer means (19).

9. A power converter (3) for a vehicle (1), comprising a system (5) according to claim 1
and a power unit (8a) accommodated in the power converter housing (6).

10. A vehicle (1), comprising an electrical machine (2), which is configured to drive the vehicle (1), and a power converter (3) according to claim 9, which is configured to provide an alternating current for the electrical machine (2).

* * * * *